(12) United States Patent
Graceffo et al.

(10) Patent No.: US 11,057,020 B1
(45) Date of Patent: Jul. 6, 2021

(54) REAL-TIME MATCHING OF TARGET REACTANCE IN NON-FOSTER MATCHING NETWORK

(71) Applicant: Raytheon Company, Waltham, MA (US)

(72) Inventors: Gary M. Graceffo, Burke, VA (US); Andrew M. Kowalevicz, Arlington, VA (US); Benjamin P. Dolgin, Alexandria, VA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/792,800

(22) Filed: Feb. 17, 2020

(51) Int. Cl.
*H03H 11/28* (2006.01)
*H04B 1/40* (2015.01)
*H03F 3/19* (2006.01)

(52) U.S. Cl.
CPC ............ *H03H 11/28* (2013.01); *H03F 3/19* (2013.01); *H04B 1/40* (2013.01); *H03F 2200/451* (2013.01)

(58) Field of Classification Search
CPC ........ H03H 11/28; H03H 11/44; H03H 11/30; H03H 11/10; H03H 7/40; H03H 7/38; H03F 3/19; H04B 1/40
See application file for complete search history.

(56) References Cited

U.S. PATENT DOCUMENTS

| | | | |
|---|---|---|---|
| 9,054,798 B2 | 6/2015 | Xu et al. | |
| 2010/0069029 A1* | 3/2010 | Chasmawala | H03J 3/06 455/200.1 |
| 2013/0009722 A1* | 1/2013 | White | H03H 7/40 333/17.3 |
| 2013/0009724 A1* | 1/2013 | Xu | H03H 11/30 333/32 |

(Continued)

FOREIGN PATENT DOCUMENTS

| | | |
|---|---|---|
| GB | 2536678 A | 9/2016 |
| WO | 2013006740 A2 | 1/2013 |

OTHER PUBLICATIONS

Wikipedia, "Common emitter," Dec. 2019, 5 pages.

(Continued)

*Primary Examiner* — Devan A Sandiford

(57) ABSTRACT

An apparatus includes a tunable non-Foster matching network having (i) an amplification stage with an amplifier and (ii) a reference reactance coupled in parallel with the amplifier. The non-Foster matching network is configured to provide a negative reactance based on the reference reactance. The amplification stage also includes at least one adjustable circuit element configured to adjust a gain of the amplification stage and thereby adjust the negative reactance. In some cases, the amplification stage may include a common emitter amplification stage having a transistor, and the at least one adjustable circuit element may include an adjustable capacitor and/or multiple adjustable resistors in (Continued)

an emitter circuit of the transistor. In other cases, the amplification stage may include an operational amplifier and multiple resistors configured to set a gain of the operational amplifier, and the at least one adjustable circuit element may include at least one of the resistors.

20 Claims, 6 Drawing Sheets

(56) References Cited

U.S. PATENT DOCUMENTS

2018/0123567 A1* 5/2018 Hu .................... H03H 11/44
2020/0203853 A1* 6/2020 Hu .................... H01Q 21/28

OTHER PUBLICATIONS

Wikipedia, "Foster's reactance theorem," Oct. 2019, 8 pages.
Wikipedia, "Negative impedance converter," May 2019, 3 pages.
Yan et al., "Non-Foster matching network design for VLF receive loop antenna," IEICE Electronics Express, vol. 13, No. 12, Jun. 2016, 10 pages.
Yan et al., "Non-Foster Matching Circuit Design via Tunable Inductor for VLF Receive Loop Antennas," International Journal of Antennas and Propagation, 2017, 11 pages.

* cited by examiner

REAL-TIME MATCHING OF TARGET REACTANCE IN NON-FOSTER MATCHING NETWORK

TECHNICAL FIELD

This disclosure is generally directed to impedance matching systems. More specifically, this disclosure is directed to real-time matching of a target reactance in a non-Foster matching network.

BACKGROUND

In order to maximize power transfer between a source and a load (such as between a transmitter and an antenna or between an antenna and a receiver), the real parts of the source and load's complex impedances should match, and the imaginary parts of the source and load's complex impedances should cancel one another. In other words, the complex impedance of the source can be expressed as "a+bi," and the complex impedance of the load can be expressed as "a−bi." Here, "a" represents the resistance of the source or load, and "bi" represents the reactance of the source or load. In one approach, a system containing the source and the load is resonated using complex conjugate matching, which is also referred to as "Foster matching." In this approach, the reactance of a capacitance is used to substantially cancel the reactance of an inductance (or vice versa).

SUMMARY

This disclosure relates to real-time matching of a target reactance in a non-Foster matching network.

In a first embodiment, an apparatus includes a tunable non-Foster matching network. The non-Foster matching network includes (i) an amplification stage having an amplifier and (ii) a reference reactance coupled in parallel with the amplifier. The non-Foster matching network is configured to provide a negative reactance based on the reference reactance. The amplification stage further includes at least one adjustable circuit element configured to adjust a gain of the amplification stage and thereby adjust the negative reactance.

In a second embodiment, a system includes a tunable non-Foster matching network and a controller. The non-Foster matching network includes (i) an amplification stage having an amplifier and (ii) a reference reactance coupled in parallel with the amplifier, where the reference reactance is coupled to an input and an output of the amplifier. The non-Foster matching network is configured to provide a negative reactance based on the reference reactance. The amplification stage further includes at least one adjustable circuit element configured to adjust a gain of the amplification stage and thereby adjust the negative reactance. The controller is configured to obtain one or more reactance measurements and to control the at least one adjustable circuit element based on the one or more reactance measurements.

In a third embodiment, a method includes obtaining one or more reactance measurements. The method also includes controlling a non-Foster matching network to adjust a negative reactance provided by the non-Foster matching network based on the one or more reactance measurements. The non-Foster matching network includes (i) an amplification stage having an amplifier and (ii) a reference reactance coupled in parallel with the amplifier, where the negative reactance is based on the reference reactance. Controlling the non-Foster matching network includes controlling at least one adjustable circuit element in the amplification stage to adjust a gain of the amplification stage and thereby adjust the negative reactance.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
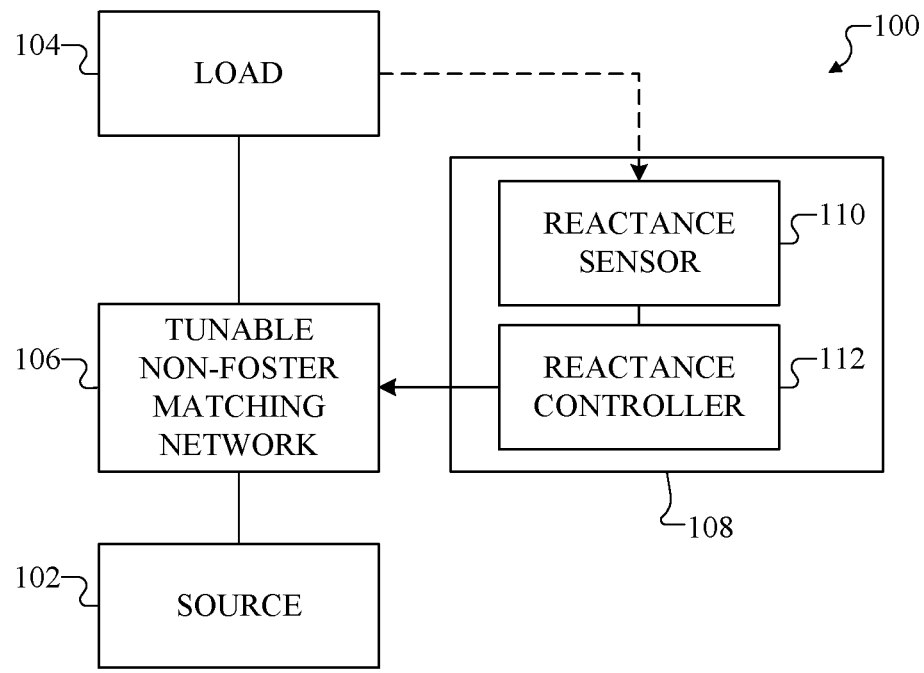
FIG. 1 illustrates an example system supporting real-time matching of a target reactance in a non-Foster matching network according to this disclosure.

FIGS. 1 through 7, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, in order to maximize power transfer between a source and a load, the real parts of the source and load's complex impedances (their resistances) should match, and the imaginary parts of the source and load's complex impedances (their reactances) should cancel one another. In one approach using Foster matching, a system containing the source and the load is resonated using complex conjugate matching, where the reactance of a capacitance is used to substantially cancel the reactance of an inductance (or vice versa). However, complex conjugate matching is lossy, meaning significant signal losses can occur when complex conjugate matching is used. Also, complex conjugate matching works best at its resonant frequency and degrades in performance as the operating frequency of the system shifts from the resonant frequency.

Another approach involves using a "non-Foster matching network," where a capacitance is cancelled using a negative capacitance and/or an inductance is cancelled using a negative inductance. This represents an active cancellation technique that creates a negative capacitance or a negative inductance using a negative reactance. In negative reactance circuits, a reference reactance is typically used to generate the desired negative reactance. While this approach can operate over a wide range of frequencies and is not limited to a particular resonant frequency, problems can arise when the imaginary part of a target system's impedance (the target system's reactance) drifts relative to the reference reactance. As a particular example, this is common with antennas in handheld devices, since the reactance of an antenna can vary based on whether the antenna is positioned close to a person or object. As a target system's impedance drifts, the cancelling effects provided by a non-Foster matching network are diminished, which reduces coupling efficiency between the source and the load and results in degraded system performance.

This disclosure provides various techniques for real-time matching of a target reactance in a non-Foster matching network. As described in more detail below, a reactance compensation system is used with a non-Foster matching network coupled between a source and a load in a target system. The reactance compensation system measures an actual reactance in the target system and adjusts the non-Foster matching network to account for changes in the measured reactance. In some embodiments, the reactance compensation system can monitor the target system and detect changes to the reactance in the target system continuously, periodically, or in any other suitable manner. Also, in some embodiments, the reactance compensation system can adjust the non-Foster matching network by changing the gain(s) of one or more amplifiers or other gain stages in the non-Foster matching network, which adjusts the apparent magnitude of the non-Foster matching network's reference reactance. This allows the non-Foster matching network to generate a negative reactance that matches or substantially matches the actual reactance of the target system, even as the actual reactance of the target system varies over time.

In this way, the reactance compensation system helps to ensure that the negative reactance generated using the non-Foster matching network can be updated based on the measured reactance in the target system, thereby providing improved impedance matching between the source and the load. Among other things, this helps to provide improved or maximum coupling efficiency between the source and the load, which can increase or maximize power transfer between the source and the load. As a particular example of this functionality, a reactance compensation system may be used in a mobile device (such as a mobile telephone, smartphone, tablet computer, or laptop computer) to account for changes in antenna impedance caused by nearby people or objects (or the absence thereof) during operation of the mobile device.

FIG. 1 illustrates an example system 100 supporting real-time matching of a target reactance in a non-Foster matching network according to this disclosure. As shown in FIG. 1, the system 100 includes a source 102, a load 104, and a tunable non-Foster matching network 106 coupling the source 102 and the load 104. The source 102 generally represents any suitable generator or other provider of at least one electrical signal, and the load 104 generally represents any suitable destination or other recipient for the at least one electrical signal. Any suitable structures may be used to implement the source 102 and the load 104.

The specific structures forming the source 102 and the load 104 can vary widely depending on the implementation. For example, in some embodiments, the source 102 may represent at least one transmitter configured to generate radio frequency (RF) signals or other electrical signals, and the load 104 may represent at least one antenna configured to receive and radiate the electrical signals as wireless signals. In other embodiments, the source 102 may represent at least one antenna configured to receive RF signals or other wireless signals and to convert the received signals into electrical signals, and the load 104 may represent at least one receiver configured to receive and process the electrical signals to recover data or perform other functions. In yet other embodiments, the source 102 may represent at least one amplifier configured to receive and amplify audio signals, and the load 104 may represent at least one speaker configured to receive the amplified audio signals and generate audible sounds. In still other embodiments, the source 102 may represent at least one electric generator configured to produce electrical power, and the load 104 may represent at least one power grid or electrical device configured to receive and transport or use the electrical power. Note, however, that any other suitable source(s) 102 and load(s) 104 may be used in FIG. 1.

It should be noted here that the labels "source" and "load" are used as a matter of convenience and do not necessarily limit the types of operations or functions that can be performed using the "source" and the "load." For example, a component may operate as a source 102 in some circumstances and as a load 104 in other circumstances. As a particular example, if a transceiver (which includes a transmitter and a receiver) is coupled to an antenna, the transceiver may function as a source 102 and the antenna may function as a load 104 when transmitting, and the transceiver may function as a load 104 and the antenna may function as a source 102 when receiving.

The non-Foster matching network 106 generally operates to provide a negative reactance used to implement a negative capacitance or a negative inductance in the system 100. In some embodiments, the non-Foster matching network 106 operates to provide a negative reactance that (together with the load 104) cancels or substantially cancels a reactance of the source 102. In other embodiments, the non-Foster matching network 106 operates to provide a negative reactance that (together with the source 102) cancels or substantially cancels a reactance of the load 104. In either case, this helps to match or closely match the negative of the imaginary part of the source's complex impedance to the imaginary part of the load's complex impedance.

As described in more detail below, the non-Foster matching network 106 includes a reference reactance, which is used by the non-Foster matching network 106 to provide the negative reactance. The non-Foster matching network 106 also includes one or more adjustable circuit elements that can be controlled in order to maintain or adjust (depending on the desired operation) the negative reactance by altering the apparent magnitude of the reference reactance. In some embodiments, for instance, the non-Foster matching network 106 may include one or more adjustable resistors or one or more adjustable capacitors, which can be used to adjust the gain(s) of one or more amplifiers or other gain stages in the non-Foster matching network 106 and thereby adjust the negative reactance produced by the non-Foster matching network 106 when needed.

Figure 3:
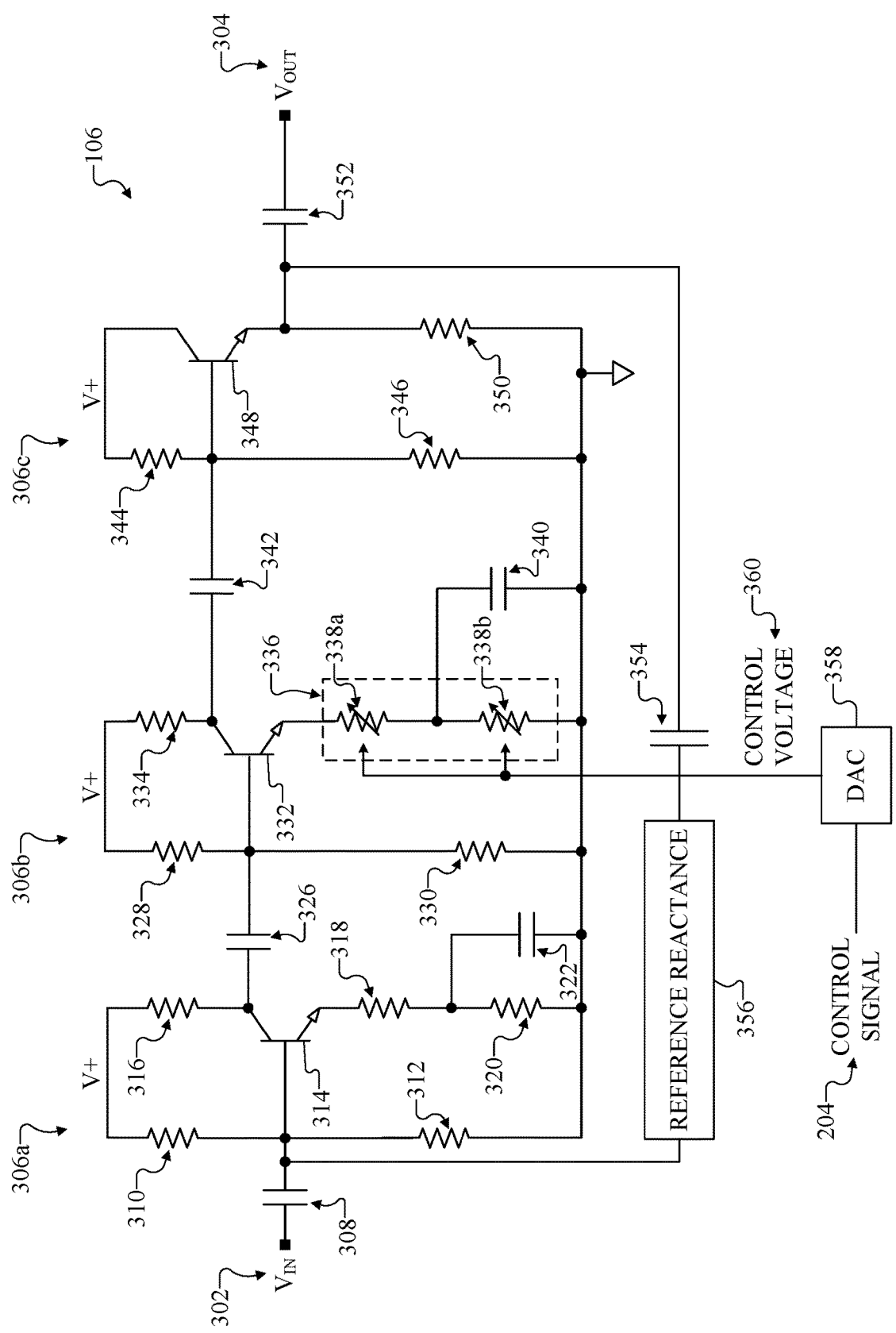
FIGS. 3 through 5 illustrate example tunable non-Foster matching networks according to this disclosure.
Figure 4:
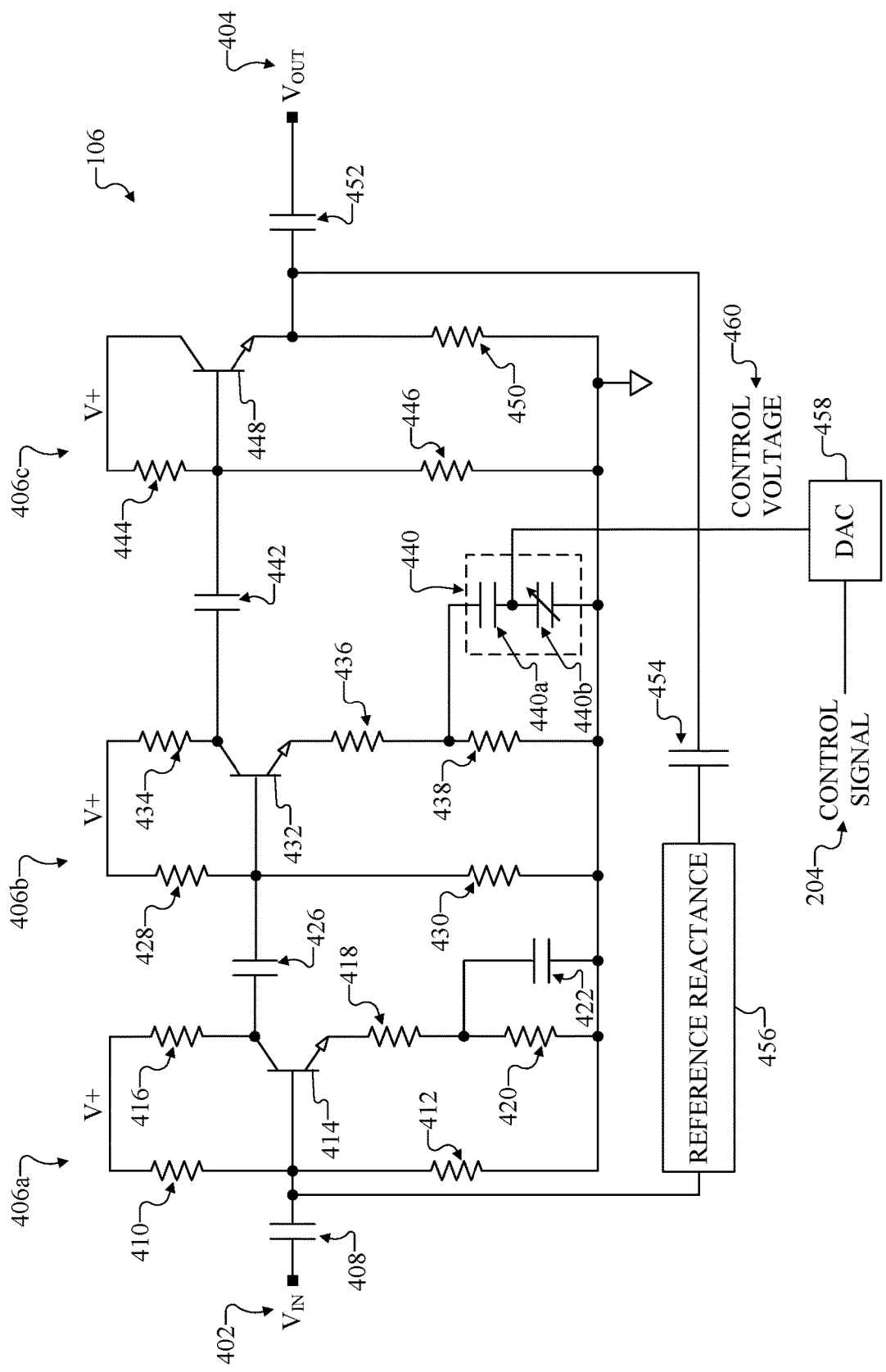
Figure 5:
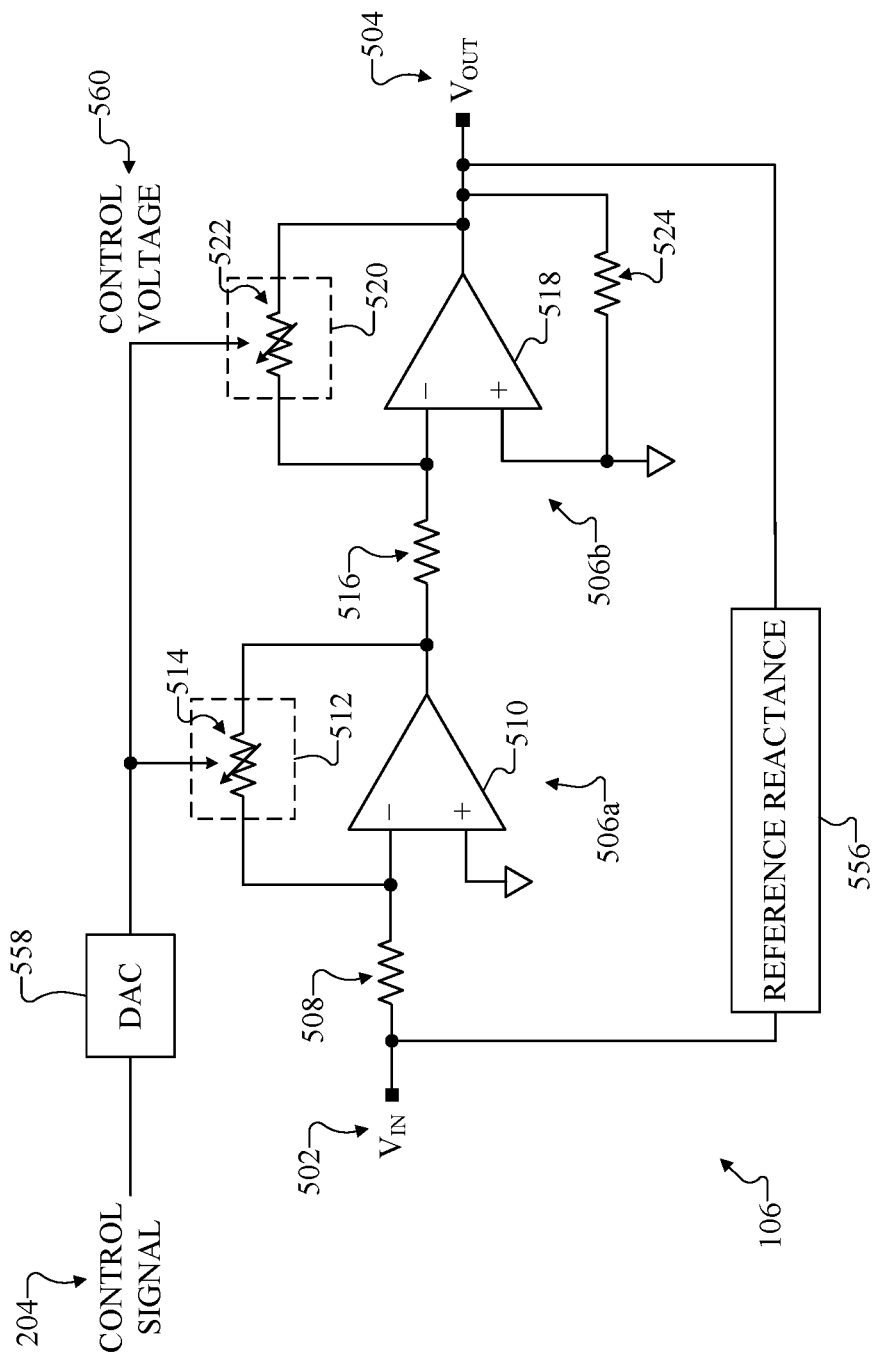

The non-Foster matching network 106 includes any suitable structure configured to provide a tunable negative reactance. Note that there are various techniques known in the art for providing a negative reactance based on a reference reactance, and any suitable techniques (now known or later developed) may be used as long as the techniques can be modified as described here to provide an adjustable negative reactance. Example embodiments of the non-Foster matching network 106 are shown in FIGS. 3 through 5, which are described below. Note, however, that the non-Foster matching network 106 may be implemented in any other suitable manner.

The operation of the non-Foster matching network 106 is controlled using a reactance compensation system 108. As shown in FIG. 1, the reactance compensation system 108 includes a reactance sensor 110, which is configured to measure the reactance of the load 104. Note, however, that the reactance sensor 110 may also or alternatively be configured to measure the reactance of the source 102. The reactance sensor 110 may measure reactance in any suitable manner, such as continuously, periodically, in response to specific triggering events, or at any other suitable time(s). The reactance sensor 110 includes any suitable structure configured to measure reactance, such as a network vector analyzer, a reactive circuit, or any other suitable reactance measuring device. Note that this disclosure is not limited to any particular technique for measuring reactance, and any suitable technique for measuring reactance (now known or later developed) may be used here.

Figure 2:
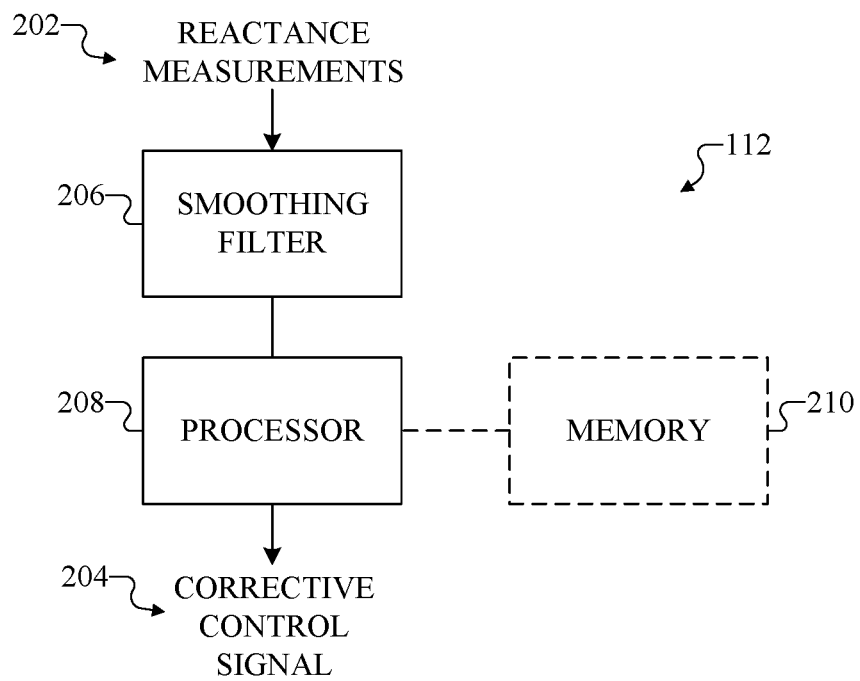
FIG. 2 illustrates an example reactance controller supporting real-time matching of a target reactance in a non-Foster matching network according to this disclosure.

The reactance compensation system 108 also includes a reactance controller 112, which is configured to use measured reactance in order to adjust operation of the non-Foster matching network 106. For example, as described in more detail below, the reactance controller 112 may generate one or more control signals used to adjust one or more components of the non-Foster matching network 106. As particular examples, the reactance controller 112 may generate one or more control signals used to adjust at least one variable resistor or variable capacitor in the non-Foster matching network 106 in order to alter the gain(s) of at least one amplifier or other gain stage and thereby alter the negative reactance generated using the non-Foster matching network 106. The reactance controller 112 includes any suitable structure configured to control one or more adjustable circuit elements of a non-Foster matching network 106 based on measured reactance. One example embodiment of the reactance controller 112 is shown in FIG. 2, which is described below. Note, however, that the reactance controller 112 may be implemented in any other suitable manner.

Although FIG. 1 illustrates one example of a system 100 supporting real-time matching of a target reactance in a non-Foster matching network 106, various changes may be made to FIG. 1. For example, various components shown in FIG. 1 may be combined, further subdivided, replicated, omitted, or rearranged and additional components may be added according to particular needs. Also, while FIG. 1 illustrates one example environment in which a non-Foster matching network 106 and a reactance compensation system 108 may be used, the non-Foster matching network 106 and the reactance compensation system 108 may be used in any other suitable system. In addition, while the non-Foster matching network 106 may be described in this document as being used to transport a signal between the source 102 and the load 104, multiple instances of the non-Foster matching network 106 may be used to transport multiple signals between the source 102 and the load 104, possibly at the same time.

FIG. 2 illustrates an example reactance controller 112 supporting real-time matching of a target reactance in a non-Foster matching network according to this disclosure. For ease of explanation, the reactance controller 112 shown in FIG. 2 may be described as being used with the non-Foster matching network 106 in the system 100 shown in FIG. 1. However, the reactance controller 112 shown in FIG. 2 may be used with any suitable non-Foster matching network and in any suitable system.

As shown in FIG. 2, the reactance controller 112 receives reactance measurements 202, which may be generated by the reactance sensor 110 using any suitable technique. The reactance measurements 202 may have any suitable form depending on the implementation, such as analog or digital values. The reactance controller 112 processes the reactance measurements 202 in order to generate one or more corrective control signals 204, which represent one or more signals that maintain or adjust the operation of the non-Foster matching network 106. For example, the one or more control signals 204 may be used to maintain or adjust one or more variable resistors or one or more variable capacitors in the non-Foster matching network 106. The one or more control signals 204 can maintain the operation of the non-Foster matching network 106 in its current configuration when no changes to the negative reactance are needed, and the one or more control signals 204 can adjust the operation of the non-Foster matching network 106 into a different configuration when changes to the negative reactance are needed. The one or more control signals 204 may have any suitable form depending on the implementation, such as one or more analog signals or one or more digital signals.

In this example, the reactance controller 112 includes at least one smoothing filter 206, which generally operates to smooth the reactance measurements 202. This can be done to obtain smoother transitions in the reactance measurements 202 and to remove transient changes in the reactance measurements 202. The smoothing filter 206 includes any suitable structure configured to filter reactance measurements, such as a low-pass filter. Note that the filter 206 may be implemented in various ways, such as an analog filter or a digital filter, depending on the form of the reactance measurements 202.

The reactance controller 112 also includes at least one processor 208, which analyzes the filtered reactance measurements in order to generate the control signal(s) 204. The processor 208 may use any suitable technique to generate control signals based on reactance measurements. In some embodiments, for example, the processor 208 may have access to a look-up table (LUT) or model that defines how the filtered reactance measurements are translated into the control signal(s) 204. In some cases, the processor 208 may perform predictive analysis to predict how the reactance of a target system may vary in the future based on the received reactance measurements 202 and thereby predict how the control signal(s) 204 might be adjusted currently or in the future. The processor 208 includes any suitable structure configured to receive inputs and generate control signal outputs. For instance, the processor 208 may include one or more microprocessors, microcontrollers, digital signal processors (DSPs), application specific integrated circuits (ASICs), field programmable gate arrays (FPGAs), or discrete circuitry.

In some embodiments, instructions or data used, generated, or collected by the processor 208 may be stored in at least one memory 210. Each memory 210 includes any suitable structure configured to store and facilitate retrieval of information, such as data, program code, and/or other suitable information on a temporary or permanent basis. The memory 210 may represent a random access memory, read only memory, hard drive, Flash memory, optical disc, or any other suitable volatile or non-volatile storage device(s).

Although FIG. 2 illustrates one example of a reactance controller 112 supporting real-time matching of a target reactance in a non-Foster matching network 106, various changes may be made to FIG. 2. For example, various components shown in FIG. 2 may be combined, further subdivided, replicated, omitted, or rearranged and additional components may be added according to particular needs. As particular examples, the filter 206 and/or at least one memory 210 may be integrated into the processor 208. Also, any other or additional pre-processing operations (instead of or in addition to) the filter 206 may be used in the reactance controller 112.

FIGS. 3 through 5 illustrate example tunable non-Foster matching networks 106 according to this disclosure. For ease of explanation, the tunable non-Foster matching networks 106 shown in FIGS. 3 through 5 may be described as being used in the system 100 shown in FIG. 1. However, the tunable non-Foster matching networks 106 shown in FIGS. 3 through 5 may be used in any suitable system.

In a conventional non-Foster matching network, the matching network includes an amplifier (with a gain A) and a reference impedance $Z_{REF}$ coupled across the amplifier, meaning the reference impedance is coupled to the input and the output of the amplifier. In this type of configuration, the input impedance $Z_{IN}$ created by the matching network using the reference impedance $Z_{REF}$ can be expressed as:

$$Z_{IN} = \frac{Z_{REF}}{1-A} = k \cdot Z_{REF} \qquad (1)$$

where:

$$k = \frac{1}{1-A} \qquad (2)$$

Based on this, it can be shown that $Z_{IN}=-Z_{REF}$ when A equals 2 (since k=−1), $Z_{IN}=-0.5 \cdot Z_{REF}$ when A equals 3 (since k=−0.5), and $Z_{IN}=-0.25 \cdot Z_{REF}$ when A equals 4 (since k=−0.25). As a result, the gain A used in a non-Foster matching network can be manipulated to adjust the negative reactance that is created using the reference reactance in the matching network. Each non-Foster matching network 106 shown in FIGS. 3 through 5 includes one or more adjustable circuit elements that can be controlled, such as by the reactance compensation system 108, in order to alter the gain(s) of at least one amplifier or other gain stage in the non-Foster matching network 106. This allows the negative reactance created using the non-Foster matching network 106 to be adjusted, which allows the negative reactance to be modified to account for changes in the actual impedance of a target system as the target system's impedance changes over time.

As shown in FIG. 3, the tunable non-Foster matching network 106 is configured to receive an input signal ($V_{IN}$) 302 and generate an output signal ($V_{OUT}$) 304. In FIG. 3, the non-Foster matching network 106 is a multi-stage structure formed by three stages 306a-306c. The first two stages 306a and 306b are amplifier or gain stages, and the third stage 306c is a buffer stage.

The first stage 306a includes a coupling capacitor 308, resistors 310, 312, a transistor 314, resistors 316, 318, 320, and a capacitor 322. The coupling capacitor 308 receives the input signal 302 and removes any constant components (such as a constant direct current or "DC" biasing voltage component) of the input signal 302. The resistors 310 and 312 function as a voltage divider between a supply voltage V+ and ground, and the voltage divider helps to bias the transistor 314 so that the transistor 314 remains in an active mode of operation across the entire range of voltages received from the coupling capacitor 308. The transistor 314 selectively operates in a conductive mode or a non-conductive mode, where the transistor 314 couples the resistor 316 to ground via the resistors 318, 320 and capacitor 322 when conductive and separates the resistor 316 from ground when not conductive. The resistors 316, 318, 320 help to establish the DC bias and gain provided by the amplification in the first stage 306a. The capacitor 322 functions as a bypass capacitor and is typically designed to provide a specified amount of reactance at the lowest signal frequencies of the input signal 302.

The coupling capacitor 308 includes any suitable capacitive structure providing any suitable capacitance. The capacitance of the coupling capacitor 308 is generally selected to remove DC biasing voltage or other constant DC components of the input signal 302. Each of the resistors 310, 312, 316, 318, 320 includes any suitable resistive structure providing any suitable resistance. The resistances of the resistors 310, 312 are generally selected to appropriately bias the transistor 314, and the resistances of the resistors 316, 318, 320 are generally selected to help provide the desired DC bias and gain. The transistor 314 includes any suitable semiconductor device configured to be controllably conductive and non-conductive, such as a bipolar junction transistor. The bypass capacitor 322 includes any suitable capacitive structure providing any suitable capacitance. The capacitance of the bypass capacitor 322 is generally selected to provide a desired minimal amount of reactance.

The second stage 306b is similar in structure and operation to the first stage 306a and includes a coupling capacitor 326, resistors 328, 330, a transistor 332, resistor 334, and a capacitor 340. However, in the second stage 306b, adjustable circuit elements 336 including two adjustable resistors 338a-338b are coupled between the transistor 332 and ground. The coupling capacitor 326 receives an input signal from the first stage 306a and removes any constant components from the input signal. The resistors 328 and 330 function as a voltage divider between the supply voltage V+ and ground to bias the transistor 332 so that the transistor 332 remains in an active mode of operation across the entire range of voltages received from the first stage 306a. The transistor 332 selectively operates in a conductive mode or a non-conductive mode, where the transistor 332 couples the resistor 334 to ground via the resistors 338a-338b and capacitor 340 when conductive and separates the resistor 334 from ground when not conductive. The resistors 334, 338a-338b establish the DC bias and gain provided by the amplification in the second stage 306b, and the capacitor 340 functions as a bypass capacitor.

The coupling capacitor 326 includes any suitable capacitive structure providing any suitable capacitance and is generally selected to remove DC biasing voltage or other constant DC components of an input voltage. Each of the resistors 328, 330, 334 includes any suitable resistive structure providing any suitable resistance, and each of the resistors 338a-338b includes any suitable resistive structure providing reconfigurable resistance (such as a digital potentiometer). The resistances of the resistors 328, 330 are generally selected to appropriately bias the transistor 332, and the resistances of the resistors 334, 338a-338b are generally selected (and controlled in the case of the resistors 338a-338b) to help provide the desired DC bias and gain. The transistor 332 includes any suitable semiconductor device configured to be controllably conductive and non-conductive, such as a bipolar junction transistor. The bypass capacitor 340 includes any suitable capacitive structure providing any suitable capacitance and is generally selected to provide a desired minimal amount of reactance.

The third stage 306c generally operates to buffer the output of the second stage 306b so that the presence or absence of the load 104 does not affect the operation of the stages 306a-306b. The third stage 306c includes a coupling capacitor 342, resistors 344-346, a transistor 348, and a resistor 350. The coupling capacitor 342 receives an input signal from the second stage 306b and removes any constant components from the input signal. The resistors 344 and 346 function as a voltage divider between the supply voltage V+ and ground to bias the transistor 348 so that the transistor 348 remains in an active mode of operation across the entire range of voltages received from the second stage 306b. The transistor 348 selectively operates in a conductive mode or a non-conductive mode, where the transistor 348 couples the supply voltage V+ to the resistor 350 when conductive and separates the supply voltage the resistor 350 when not conductive. The resistor 350 (without a corresponding resistor above the transistor 348) establishes that the transistor 348 is buffering its input and not providing amplification (at least to any significant or measurable extent). An output capacitor 352 is coupled to the transistor 348 and the resistor 350 and generally operates to produce the output signal 304.

The coupling capacitor 342 includes any suitable capacitive structure providing any suitable capacitance and is generally selected to remove DC biasing voltage or other constant DC components of an input voltage. Each of the resistors 344, 346, 350 includes any suitable resistive structure providing any suitable resistance. The resistances of the resistors 344, 346 are generally selected to appropriately bias the transistor 348, and the resistance of the resistor 350 is generally selected to help provide the desired DC bias. The transistor 348 includes any suitable semiconductor device configured to be controllably conductive and non-conductive, such as a bipolar junction transistor. The output capacitor 352 includes any suitable capacitive structure providing any suitable capacitance and is generally selected to help filter or smooth the output signal 304.

In this particular example, the stages 306a and 306b represent cascaded "common emitter" amplification or gain stages due to the use of the bipolar junction transistors 314, 332 and the configuration of the other components with the transistors 314, 332. Also, in this particular example, the stage 306c represents a "emitter follower" buffer stage due to the use of the bipolar junction transistor 348 and the configuration of the other components with the transistor 348. However, the stages 306a-306c may be implemented in any other suitable manner using any other suitable transistors.

A capacitor 354 is coupled to the output of the third stage 306c and to a reference reactance 356. The capacitor 354 includes any suitable capacitive structure providing any suitable capacitance and generally provides a small amount of capacitance. The reference reactance 356 represents a reactance that is coupled across various components of the stages 306a-306c and that provides a specified or predefined amount of reactance. The reference reactance 356 is typically based on the nominal impedance of a target system. In some embodiments, the reference reactance 356 may represent the largest amount of reactance that might be needed to produce a tunable amount of negative reactance (since the negative reactance cannot have a magnitude that is larger than the magnitude of the reference reactance 356). The reference reactance 356 includes any suitable structure configured to provide a specified amount of reactance.

In FIG. 3, the alternating current (AC) gain of the second stage 306b is defined by the resistor 338a and the capacitor 340, while the DC bias of the second stage 306b is defined by the resistors 338a-338b. Thus, it is possible to adjust the resistance of the resistor 338a in order to change the AC gain of the second stage 306b and thereby adjust the negative reactance that is created using the reference reactance 356.

For example, the reactance compensation system 108 may operate using Equations (1) and (2) above to determine how to adjust the AC gain of the second stage 306b in order to adjust the negative reactance ($Z_{IN}$). In order to maintain the DC bias of the second stage 306b in the presence of the changing resistance of the resistor 338a, the resistor 338b can be adjusted opposite the change to the resistor 338a so that a sum of the resistances of the resistors 338a-338b remains constant or substantially constant. As a result, it is possible to adjust the resistance of the resistor 338a in order to adjust the negative reactance while maintaining the DC bias of the second stage 306b. In this way, the non-Foster matching network 106 of FIG. 3 can be controlled so that the negative reactance provided by the non-Foster matching network 106 is adjusted, which is accomplished by modifying AC current flow in the second stage 306b while maintaining DC characteristics of the second stage 306b. More particularly, the AC current flow in the emitter circuit of the transistor 332 (the resistors 338a-338b and capacitor 340) can be controlled so that the negative reactance provided by the non-Foster matching network 106 is adjusted.

In this example, the adjustable resistors 338a-338b are controlled using a digital-to-analog converter (DAC) 358, which receives at least one control signal 204 from the reactance compensation system 108 and converts the at least one control signal 204 into at least one analog control voltage 360 that is used to control the adjustable resistors 338a-338b. However, the adjustable resistors 338a-338b may be controlled in any other suitable manner, such as digitally or based on the one or more control signals 204 without conversion. This disclosure is not limited to any particular technique for controlling and varying the resistances of the adjustable resistors 338a-338b.

It should be noted here that while the second stage 306b includes the adjustable circuit elements 336 in FIG. 3, it is possible for the first stage 306a to also or alternatively include adjustable circuit elements 336 in the same or similar configuration. It should also be noted here that two amplification stages 306a-306b are used in FIG. 3 since each amplification stage 306a-306b produces an inverted or phase-shifted version of its input signal, so the use of two amplification stages 306a-306b helps to restore the phase of the output signal 304 relative to the input signal 302. However, if this is not required or is handled in other ways, a single amplification stage may be used. Further, note that the third stage 306c may be omitted if buffering is handled in other ways. In addition, note that more than two amplification stages may be used in the non-Foster matching network 106 of FIG. 3. In some embodiments, the amplification stages used in the tunable non-Foster matching network 106 of FIG. 3 may collectively provide a phase shift of a or $2\pi$ integer multiple of $2\pi$ between the input to the first amplification stage and the output of the last amplification stage.

As shown in FIG. 4, the tunable non-Foster matching network 106 is configured to receive an input signal ($V_{IN}$) 402 and generate an output signal ($V_{OUT}$) 404. In FIG. 4, the non-Foster matching network 106 is a multi-stage structure formed by three stages 406a-406c. The first two stages 406a and 406b are amplifier or gain stages, and the third stage 406c is a buffer stage. The components 408-434 and 442-460 shown in FIG. 4 may be the same as or similar to the corresponding components 308-334 and 342-360 shown in FIG. 4.

In the example shown in FIG. 4, the adjustable resistors 338a-338b of FIG. 3 have been replaced by resistors 436 and 438, and the bypass capacitor 340 of FIG. 3 has been replaced by an adjustable circuit element 440 that includes a fixed capacitor 440a (which provides a fixed amount of capacitance) and an adjustable capacitor 440b (which provides an adjustable amount of capacitance). In this example, the resistors 436 and 438 are fixed, so the sum of their resistances and therefore the DC bias of the second stage 406b are fixed. To provide controllable AC gain in FIG. 4, the capacitance of the adjustable capacitor 440b can be controlled and varied as needed. More particularly, the AC current flow in the emitter circuit of the transistor 432 (the resistors 436 and 438 and capacitors 440a-440b) can be controlled so that the negative reactance provided by the non-Foster matching network 106 is adjusted.

The adjustable capacitor 440b includes any suitable capacitive structure providing reconfigurable capacitance, such as a variable capacitance diode or "varicap." The fixed capacitor 440a includes any suitable capacitive structure providing any suitable capacitance, such as a desired minimal amount of capacitance. Note that while fixed and adjustable capacitors 440a-440b are shown here, the fixed capacitor 440a may be omitted.

In this example, the adjustable capacitor 440b is controlled using a DAC 458, which receives at least one control signal 204 from the reactance compensation system 108 and converts the at least one control signal 204 into a control voltage 460 that is used to control the adjustable capacitor 440b. However, it should be noted that the adjustable capacitor 440b may be controlled in any other suitable manner, such as digitally or based on the one or more control signals 204 without conversion. This disclosure is not limited to any particular technique for controlling and varying the capacitance of the adjustable capacitor 440b.

It should be noted here that while the second stage 406b includes the adjustable circuit element 440 in FIG. 4, it is possible for the first stage 406a to also or alternatively include adjustable circuit element 440 in the same or similar configuration. It should also be noted here that two amplification stages 406a-406b are used in FIG. 4 since each amplification stage 406a-406b produces an inverted or phase-shifted version of its input signal, so the use of two amplification stages 406a-406b helps to restore the phase of the output signal 404 relative to the input signal 402. However, if this is not required or is handled in other ways, a single amplification stage may be used. Further, note that the third stage 406c may be omitted if buffering is handled in other ways. In addition, note that more than two amplification stages may be used in the non-Foster matching network 106 of FIG. 4. In some embodiments, the amplification stages used in the tunable non-Foster matching network 106 of FIG. 4 may collectively provide a phase shift of a or an integer multiple of a between the input to the first amplification stage and the output of the last amplification stage.

As shown in FIG. 5, the tunable non-Foster matching network 106 is configured to receive an input signal ($V_{IN}$) 502 and generate an output signal ($V_{OUT}$) 504. In FIG. 5, the non-Foster matching network 106 is a multi-stage structure formed by two cascaded stages 506a-506b, both of which are amplifier or gain stages.

The first stage 506a includes a resistor 508, an amplifier 510, and an adjustable circuit element 512 that includes at least one adjustable resistor 514. The amplifier 510 provides amplification of its input signal, and the amount of amplification is controlled by a ratio of the resistance of the resistor 514 to the resistance of the resistor 508. The second stage 506b includes a resistor 516, an amplifier 518, an adjustable circuit element 520 that includes at least one adjustable resistor 522, and a resistor 524. Again, the amplifier 518 provides amplification of its input signal, and the amount of amplification is controlled by a ratio of the resistance of the resistor 522 to the resistance of the resistor 516. The resistor 524 is coupled between the output of the amplifier 518 and the non-inverting input of the amplifier 518.

Each of the resistors 508, 516, 524 includes any suitable resistive structure providing any suitable resistance, and each of the resistors 514, 522 includes any suitable resistive structure providing reconfigurable resistance (such as a digital potentiometer). The resistances of the resistors 508, 514, 516, 522 are generally selected (and controlled in the case of the resistors 514, 522) to help provide the desired gains in the stages 506a-506b. Each of the amplifiers 510, 518 includes any suitable structure configured to provide suitable amplification, such as an operational amplifier ("op amp").

A reference reactance 556 is coupled across components of the non-Foster matching network 106 in FIG. 5 and provides a specified amount of reactance. By adjusting the gain in the stages 506a-506b here, the negative reactance generated using the reference reactance 556 can be altered, allowing the non-Foster matching network 106 to vary the negative reactance used with a target system as the target system's impedance changes over time. In the example shown in FIG. 5, the adjustable resistors 514, 522 allow the gain provided by the amplifiers 510, 518 to be controlled by altering the ratio of the resistances used with the amplifiers 510, 518.

It should be noted here that while both stages 506a-506b here include circuit elements 512, 520, it is possible for only one stage to include one or more adjustable circuit elements. It should also be noted here that two amplification stages 506a-506b are used in FIG. 5 since each amplification stage 506a-506b is arranged as an inverting amplification stage, so the use of two amplification stages 506a-506b helps to restore the phase of the output signal 504 relative to the input signal 502. However, if this is not required or is handled in other ways, a single amplification stage may be used. In addition, note that more than two amplification stages may be used in the non-Foster matching network 106 of FIG. 5. In some embodiments, the amplification stages used in the tunable non-Foster matching network 106 of FIG. 5 may collectively provide a phase shift of a or an integer multiple of a between the input to the first amplification stage and the output of the last amplification stage.

Although FIGS. 3 through 5 illustrate examples of tunable non-Foster matching networks 106, various changes may be made to FIGS. 3 through 5. For example, the gain or gains used in a tunable non-Foster matching network 106 may be modified in any other suitable manner. Also, a combination of approaches shown in FIGS. 3 through 5 may be used. As a particular example, a single gain stage in a tunable non-Foster matching network 106 may include both the adjustable resistors 338a-338b and the adjustable capacitor 440b. As another particular example, one gain stage in a tunable non-Foster matching network 106 may include the adjustable resistors 338a-338b, and another gain stage in the tunable non-Foster matching network 106 may include the adjustable capacitor 440b.

Figure 6:
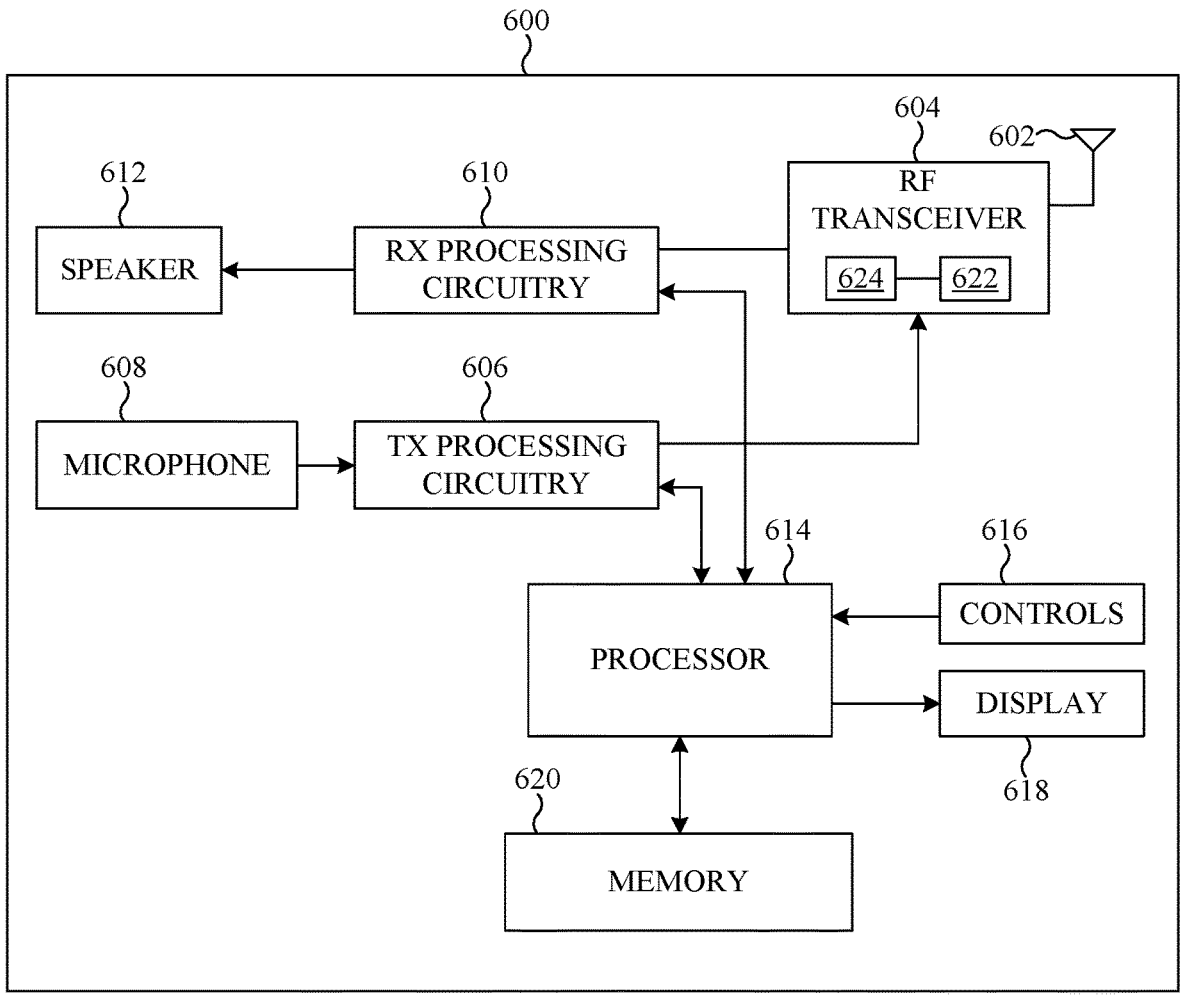
FIG. 6 illustrates a specific example of a device supporting real-time matching of a target reactance in a non-Foster matching network according to this disclosure.

FIG. 6 illustrates a specific example of a device 600 supporting real-time matching of a target reactance in a non-Foster matching network according to this disclosure. For ease of explanation, the device 600 shown in FIG. 6 may be described as representing a mobile device or other device that incorporates at least one instance of a non-Foster matching network 106 and at least one instance of a reactance compensation system 108. However, any other suitable device or system may incorporate at least one non-Foster matching network 106 and at least one reactance compensation system 108, which can be used in any suitable manner.

As shown in FIG. 6, the device 600 includes at least one antenna 602, at least one RF transceiver 604, transmit (TX) processing circuitry 606, at least one microphone 608, receive (RX) processing circuitry 610, and at least one speaker 612. The device 600 also includes at least one processor 614, one or more physical controls 616, at least one display 618, and at least one memory 620. The antenna 602 is used to radiate outgoing RF electrical signals as wireless signals and to convert incoming wireless signals into RF electrical signals.

The RF transceiver 604 receives, from the antenna 602, the RF electrical signals representing incoming wireless signals, such as cellular, WiFi, BLUETOOTH, or navigation signals. The RF transceiver 604 down-converts the incoming RF signals to generate intermediate frequency (IF) or baseband signals. The IF or baseband signals are sent to the receive processing circuitry 610, which generates processed baseband signals by filtering, decoding, digitizing, and/or otherwise processing the baseband or IF signals. The receive processing circuitry 610 can transmit the processed baseband signals to the speaker 612 or to the processor 614 for further processing.

The transmit processing circuitry 606 receives analog or digital data from the microphone 608 or other outgoing baseband data from the processor 614. The transmit processing circuitry 606 encodes, multiplexes, digitizes, and/or otherwise processes the outgoing baseband data to generate processed baseband or IF signals. The RF transceiver 604 receives the outgoing processed baseband or IF signals from the transmit processing circuitry 606 and up-converts the baseband or IF signals to RF electrical signals that are transmitted via the antenna 602.

Each antenna 602 includes any suitable structure configured to transmit wireless signals and/or receive wireless signals. In some embodiments, an antenna 602 may represent a loop antenna. Also, in some embodiments, an antenna 602 may represent an antenna array having multiple antenna elements arranged in a desired pattern. Each transceiver 604 includes any suitable structure configured to generate outgoing RF signals for transmission and/or process incoming RF signals. Note that while shown as an integrated device, a transceiver 604 may be implemented using a transmitter and a separate receiver. The transmit processing circuitry 606 includes any suitable structure configured to encode, multiplex, digitize, or otherwise process data to generate signals containing the data. Each microphone 608 includes any suitable structure configured to capture audio signals. The receive processing circuitry 610 includes any suitable structure configured to filter, decode, digitize, or otherwise process signals to recover data from the signals. Each speaker 612 includes any suitable structure configured to generate audio signals. Note that if the device 600 only supports one-way communication, a transceiver 604 may be replaced with either a transmitter or a receiver, and either the transmit processing circuitry 606 or the receive processing circuitry 610 can be omitted.

The processor 614 include one or more processors or other processing devices and execute an operating system, applications, or other logic stored in the memory 620 in order to control the overall operation of the device 600. For example, the processor 614 can control the transmission, reception, and processing of signals by the RF transceiver 604, the receive processing circuitry 610, and the transmit processing circuitry 606 in accordance with well-known principles. The processor 614 is also configured to execute other processes and applications resident in the memory 620, and the processor 614 can move data into or out of the memory 620 as required by an executing application. The processor 614 includes any suitable processing device or devices, such as one or more microprocessors, microcontrollers, DSPs, ASICs, FPGAs, or discrete circuitry.

The processor 614 is coupled to the physical controls 616 and the display 618. A user of the device 600 can use the physical controls 616 to invoke certain functions, such as powering on or powering off the device 600 or controlling a volume of the device 600. The display 618 may be a liquid crystal display (LCD), light emitting diode (LED) display, organic light emitting diode (OLED) display, quantum light emitting diode (QLED) display, or other display configured to render text and graphics. If the display 618 denotes a touchscreen configured to receive touch input, fewer or no physical controls 616 may be needed in the device 600.

The memory 620 is coupled to the processor 614. The memory 620 stores instructions and data used, generated, or collected by the processor 614 or by the device 600. In some embodiments, part of the memory 620 can include a random access memory, and another part of the memory 620 can include a Flash memory or other read only memory. Each memory 620 includes any suitable volatile or non-volatile structure configured to store and facilitate retrieval of information.

The device 600 includes one or more non-Foster matching networks 622 and one or more reactance compensation systems 624. In this example, the transceiver 604 includes one or more non-Foster matching networks 622 and one or more reactance compensation systems 624. Each non-Foster matching network 622 may be used to couple the transceiver 604 (as a source 102) to the antenna 602 (as a load) or to couple the transceiver 604 (as a load 104) to the antenna 602 (as a source 102). Each non-Foster matching network 622 may be implemented in any suitable manner, such as by using any of the implementations shown in FIGS. 3 through 5. Each reactance compensation system 624 may be used to adjust the operation of at least one corresponding non-Foster matching network 622. Each reactance compensation system 624 may be implemented in any suitable manner, such as by using the implementation shown in FIG. 2.

Note that the processor 208 and the memory 210 described above as being used in the reactance compensation system 108 may or may not be represented by the processor 614 and memory 620 shown in FIG. 6. That is, an instance of the reactance compensation system 624 used in the device 600 may include its own processor 208 and memory 210, or the functionality of the processor 208 and the memory 210 of the reactance compensation system(s) 624 may be implemented using the processor 614 and the memory 620 of the device 600.

Although FIG. 6 illustrates one specific example of a device 600 supporting real-time matching of a target reactance in a non-Foster matching network, various changes may be made to FIG. 6. For example, various components shown in FIG. 6 may be combined, further subdivided, replicated, omitted, or rearranged and additional components may be added according to particular needs. As a particular example, the processor 614 may be divided into multiple processors, such as one or more central processing units (CPUs) and one or more graphics processing units (GPUs). As another example, components such as the microphone 608 and speaker 612 may not be needed, depending on the type of device being used. In addition, mobile devices and other computing or communication devices come in a wide variety of configurations, and FIG. 6 does not limit the non-Foster matching network 106 and the reactance compensation system 108 to use in any particular mobile device or other computing or communication device.

Figure 7:
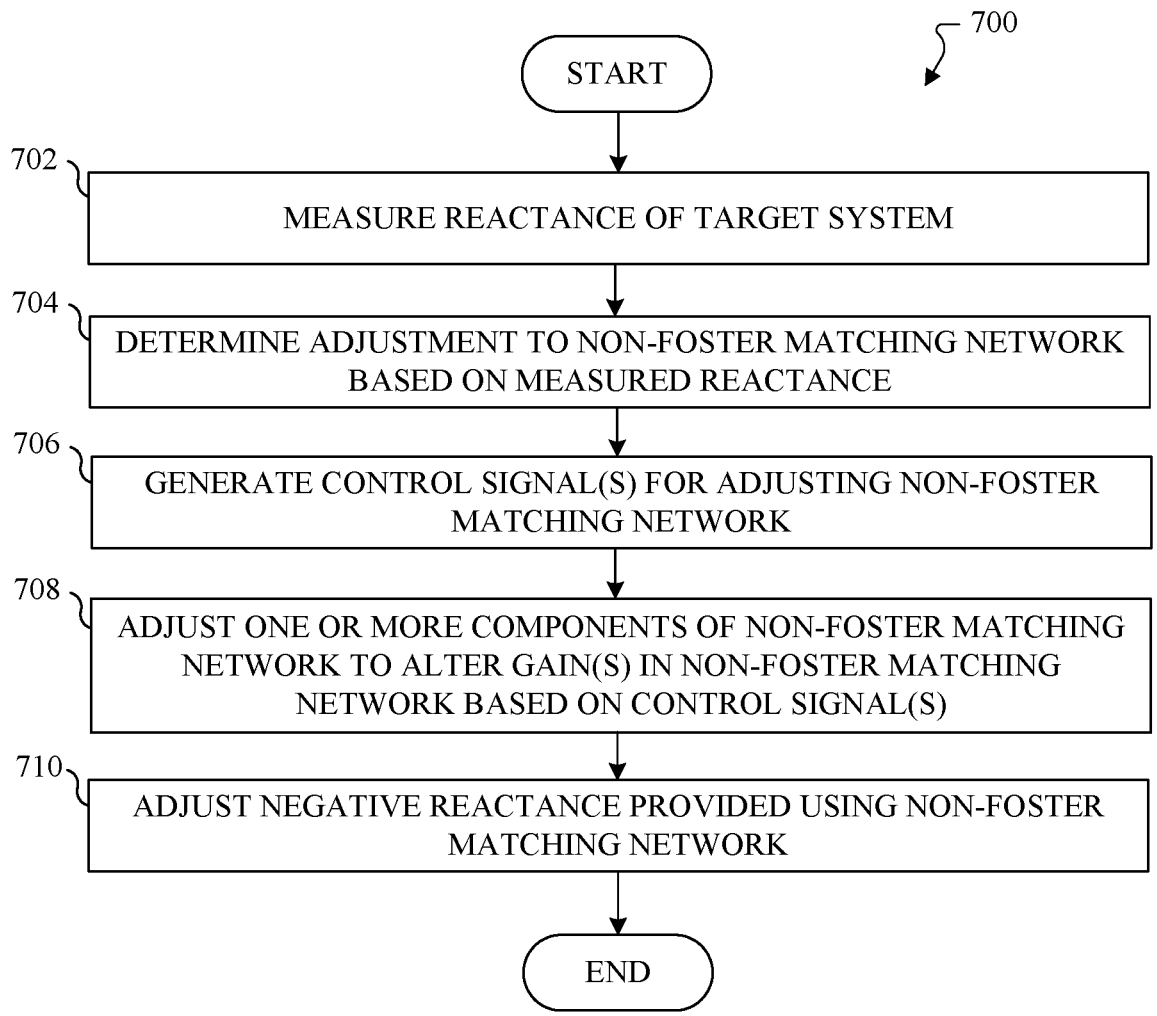
FIG. 7 illustrates an example method for real-time matching of a target reactance in a non-Foster matching network according to this disclosure.

FIG. 7 illustrates an example method 700 for real-time matching of a target reactance in a non-Foster matching network according to this disclosure. For ease of explanation, the method 700 shown in FIG. 7 may be described as involving the use of the non-Foster matching network 106 of FIG. 3, 4, or 5 and the reactance compensation system 108 of FIG. 2 in the system 100 of FIG. 1. However, the method 700 shown in FIG. 7 may involve the use of any suitable non-Foster matching network and any suitable reactance compensation system. Also, the non-Foster matching networks 106 of FIGS. 3 through 5 and the reactance compensation system 108 of FIG. 2 may be used in any other suitable device or system, such as the device 600 of FIG. 6.

As shown in FIG. 7, a reactance of a target system is measured at step 702. This may include, for example, the reactance sensor 110 generating one or more measurements 202 of a reactance in the system 100. As a particular example, this may include the reactance sensor 110 generating one or more measurements 202 of the reactance of the source 102 and/or the reactance of the load 104 in the system 100. As noted above, any suitable technique or techniques may be used to measure the reactance of one or more components of a target system.

At least one adjustment to a non-Foster matching network is determined based on the reactance measurement(s) at step 704. This may include, for example, the smoothing filter 206 of the reactance compensation system 108 receiving and filtering the reactance measurements 202. This may also include the processor 208 of the reactance compensation system 108 analyzing the filtered reactance measurements to determine whether to adjust (and if so, how to adjust) one or more adjustable circuit elements 336, 440, 512, 520 in a non-Foster matching network 106. As described above, any suitable technique or techniques may be used to determine how to adjust one or more adjustable circuit elements 336, 440, 512, 520 based on reactance measurements, such as a look-up table, model, or predictive analysis.

At least one control signal for adjusting the non-Foster matching network is generated at step 706. This may include, for example, the processor 208 of the reactance compensation system 108 generating at least one corrective control signal 204 that is configured to cause the desired adjustment(s) to one or more adjustable circuit elements 336, 440, 512, 520 of the non-Foster matching network 106. As a particular example, this may include the processor 208 of the reactance compensation system 108 generating one or more digital words or other values in at least one corrective control signals 204, where the digital word(s) or other value(s) can be converted into at least one control voltage 360, 460, 560 or otherwise used to adjust one or more adjustable circuit elements 336, 440, 512, 520 of the reactance compensation system 108.

One or more components of the non-Foster matching network are adjusted to alter at least one gain in the non-Foster matching network based on the control signal(s) at step 708. In some embodiments, this may include changing the resistance of the adjustable resistor 338a in the non-Foster matching network of FIG. 3 to alter the AC gain of an amplification stage, as well as changing the resistance of the adjustable resistor 338b in the non-Foster matching network 106 of FIG. 3 to maintain the DC bias of the amplification stage at a constant or substantially constant value. In other embodiments, this may include changing the capacitance of the adjustable capacitor 440b in the non-Foster matching network 106 of FIG. 4 to alter the AC gain of an amplification stage. In still embodiments, this may include changing the resistance(s) of the adjustable resistor(s) 514, 522 in the non-Foster matching network 106 of FIG. 5 to alter the AC gain of one or more amplification stages. During this process, the gain(s) of any suitable number of amplification stages may be adjusted, and the gain of any specific amplification stage may be adjusted in any suitable manner.

This adjusts the negative reactance provided using the non-Foster matching network at step 710. As noted above, the negative reactance provided using the non-Foster matching network 106 may be adjusted by altering the gain(s) in the non-Foster matching network 106 in order to match or substantially match the negative reactance provided using the non-Foster matching network 106 with the measured reactance in the target system. In some cases, the magnitude of the negative reactance cannot exceed the magnitude of the reference reactance 356, 456, 556, but the magnitude of the negative reactance can be varied significantly below that level using appropriate changes to the gain(s) in the non-Foster matching network 106.

Although FIG. 7 illustrates one example of a method 700 for real-time matching of a target reactance in a non-Foster matching network, various changes may be made to FIG. 7. For example, while shown as a series of steps, various steps in FIG. 7 may overlap, occur in parallel, or occur any number of times. As a particular example, step 702 may occur repeatedly over time in order to sense reactance changes in the target system over time. As another particular example, step 702 may occur repeatedly before it is finally determined that an adjustment to the non-Foster matching network 106 is needed.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a tunable non-Foster matching network comprising:
an amplification stage comprising an amplifier; and
a reference reactance coupled in parallel with the amplifier;
wherein the non-Foster matching network is configured to provide a negative reactance based on the reference reactance; and
wherein the amplification stage further comprises at least one adjustable circuit element configured to adjust a gain of the amplification stage and thereby adjust the negative reactance.

2. The apparatus of claim 1, wherein:
the non-Foster matching network comprises multiple cascaded amplification stages, the amplification stages comprising multiple amplifiers;
the reference reactance is coupled in parallel with the multiple amplifiers; and
each of at least one of the amplification stages comprises at least one adjustable circuit element.

3. The apparatus of claim 1, wherein:
the amplification stage comprises a common emitter amplification stage comprising a transistor; and
the at least one adjustable circuit element is configured to adjust an alternating current (AC) gain of the common emitter amplification stage.

4. The apparatus of claim 3, wherein:
the at least one adjustable circuit element comprises an adjustable capacitor in an emitter circuit of the transistor; and
the adjustable capacitor is configured to control the AC gain of the common emitter amplification stage.

5. The apparatus of claim 3, wherein:
the at least one adjustable circuit element comprises multiple adjustable resistors in an emitter circuit of the transistor;
a first of the adjustable resistors and a capacitor in the emitter circuit are configured to control the AC gain of the common emitter amplification stage; and
the first adjustable resistor and a second of the adjustable resistors are configured to control a direct current (DC) bias of the common emitter amplification stage.

6. The apparatus of claim 1, wherein:
the amplification stage comprises an operational amplifier and multiple resistors configured to set a gain of the operational amplifier; and
the at least one adjustable circuit element comprises at least one of the resistors, the at least one of the resistors comprising an adjustable resistor.

7. The apparatus of claim 1, wherein:
a magnitude of the negative reactance cannot exceed a magnitude of the reference reactance; and
the magnitude of the negative reactance is variable below the magnitude of the reference reactance based on the gain of the amplification stage.

8. A system comprising:
a tunable non-Foster matching network comprising:
an amplification stage comprising an amplifier; and
a reference reactance coupled in parallel with the amplifier, the reference reactance coupled to an input and an output of the amplifier;
wherein the non-Foster matching network is configured to provide a negative reactance based on the reference reactance; and
wherein the amplification stage further comprises at least one adjustable circuit element configured to adjust a gain of the amplification stage and thereby adjust the negative reactance; and
a controller configured to obtain one or more reactance measurements and to control the at least one adjustable circuit element based on the one or more reactance measurements.

9. The system of claim 8, wherein:
the non-Foster matching network comprises multiple cascaded amplification stages, the amplification stages comprising multiple amplifiers;
the reference reactance is coupled in parallel with the multiple amplifiers; and
each of at least one of the amplification stages comprises at least one adjustable circuit element.

10. The system of claim 8, wherein:
the amplification stage comprises a common emitter amplification stage comprising a transistor; and
the at least one adjustable circuit element is configured to adjust an alternating current (AC) gain of the common emitter amplification stage.

11. The system of claim 10, wherein:
the at least one adjustable circuit element comprises an adjustable capacitor in an emitter circuit of the transistor; and
the adjustable capacitor is configured to control the AC gain of the common emitter amplification stage.

12. The system of claim 10, wherein:
the at least one adjustable circuit element comprises multiple adjustable resistors in an emitter circuit of the transistor;

a first of the adjustable resistors and a capacitor in the emitter circuit are configured to control the AC gain of the common emitter amplification stage; and the first adjustable resistor and a second of the adjustable resistors are configured to control a direct current (DC) bias of the common emitter amplification stage.

13. The system of claim 8, wherein:

the amplification stage comprises an operational amplifier and multiple resistors configured to set a gain of the operational amplifier; and the at least one adjustable circuit element comprises at least one of the resistors, the at least one of the resistors comprising an adjustable resistor.

14. The system of claim 8, further comprising:

a filter configured to filter multiple reactance measurements and to provide the filtered reactance measurements to the controller.

15. The system of claim 8, further comprising:

a source configured to provide an electrical signal; and a load configured to receive the electrical signal;

wherein the non-Foster matching network electrically couples the source and the load.

16. The system of claim 15, further comprising:

a reactance sensor configured to measure a reactance of at least one of the source and the load and to generate the one or more reactance measurements.

17. The system of claim 8, further comprising:

an antenna configured to at least one of transmit and receive wireless signals; and a transceiver configured to generate electrical signals to be radiated by the antenna and to receive electrical signals provided by the antenna;

wherein the non-Foster matching network electrically couples the antenna and the transceiver; and wherein the one or more reactance measurements are associated with at least one of the antenna and the transceiver.

18. A method comprising:

obtaining one or more reactance measurements; and controlling a non-Foster matching network to adjust a negative reactance provided by the non-Foster matching network based on the one or more reactance measurements;

wherein the non-Foster matching network comprises:

an amplification stage comprising an amplifier; and a reference reactance coupled in parallel with the amplifier, the negative reactance based on the reference reactance; and wherein controlling the non-Foster matching network comprises controlling at least one adjustable circuit element in the amplification stage to adjust a gain of the amplification stage and thereby adjust the negative reactance.

19. The method of claim 18, wherein:

the amplification stage comprises a common emitter amplification stage comprising a transistor; and controlling the non-Foster matching network comprises controlling an alternating current (AC) gain of the common emitter amplification stage using at least one of an adjustable capacitor and multiple adjustable resistors in an emitter circuit of the transistor.

20. The method of claim 18, wherein:

the amplification stage comprises an operational amplifier and multiple resistors configured to set a gain of the operational amplifier; and controlling the non-Foster matching network comprises controlling at least one of the resistors, the at least one of the resistors comprising an adjustable resistor.

* * * * *